(12) United States Patent
Kwak et al.

(10) Patent No.: US 12,016,187 B2
(45) Date of Patent: Jun. 18, 2024

(54) ENCAPSULATING COMPOSITION

(71) Applicant: LG Chem, Ltd., Seoul (KR)

(72) Inventors: Ji Won Kwak, Daejeon (KR); Joon Hyung Kim, Daejeon (KR); Kook Hyun Choi, Daejeon (KR); Mi Lim Yu, Daejeon (KR); Yung Jong Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 819 days.

(21) Appl. No.: 16/972,233

(22) PCT Filed: Sep. 10, 2019

(86) PCT No.: PCT/KR2019/011683
§ 371 (c)(1),
(2) Date: Dec. 4, 2020

(87) PCT Pub. No.: WO2020/055085
PCT Pub. Date: Mar. 19, 2020

(65) Prior Publication Data
US 2021/0234111 A1 Jul. 29, 2021

(30) Foreign Application Priority Data
Sep. 11, 2018 (KR) .................. 10-2018-0108025

(51) Int. Cl.
*H10K 10/88* (2023.01)
*C08G 59/22* (2006.01)
(Continued)

(52) U.S. Cl.
CPC ........... *H10K 10/88* (2023.02); *C08G 59/226* (2013.01); *C08G 59/24* (2013.01); *C08K 5/01* (2013.01); *C09D 11/101* (2013.01); *C09D 11/38* (2013.01)

(58) Field of Classification Search
CPC ...... H10K 10/88; C08G 59/226; C08G 59/24; C08K 5/01; C09D 11/01; C09D 11/38
See application file for complete search history.

(56) References Cited

U.S. PATENT DOCUMENTS

2006/0162771 A1* 7/2006 Inoue ................. H01M 14/005
136/263
2014/0217621 A1 8/2014 Yoo et al.
(Continued)

FOREIGN PATENT DOCUMENTS

JP 2004111380 A 4/2004
JP 2006294276 A 10/2006
(Continued)

OTHER PUBLICATIONS

International Search Report for Application No. PCT/KR2019/011683 mailed Dec. 13, 2019, 4 pages.

*Primary Examiner* — Ling Siu Choi
*Assistant Examiner* — Andrea Wu
(74) *Attorney, Agent, or Firm* — Lerner David LLP

(57) ABSTRACT

The present application provides an encapsulating composition which can effectively block moisture or oxygen introduced into an organic electronic device from the outside, and has excellent spreadability, is applicable to thin organic electronic devices and has excellent hardness of the cured product after curing, without causing an inter-circuit interference problem.

13 Claims, 1 Drawing Sheet

(51) Int. Cl.
*C08G 59/24* (2006.01)
*C08K 5/01* (2006.01)
*C09D 11/101* (2014.01)
*C09D 11/38* (2014.01)

(56) References Cited

U.S. PATENT DOCUMENTS

| | | |
|---|---|---|
| 2016/0020426 A1 | 1/2016 | Aoyama et al. |
| 2018/0208804 A1 | 7/2018 | Mieda et al. |
| 2019/0300746 A1 | 10/2019 | Yu et al. |
| 2019/0309160 A1 | 10/2019 | Woo et al. |
| 2019/0334121 A1 | 10/2019 | Choi et al. |
| 2020/0079947 A1 | 3/2020 | Choi et al. |
| 2020/0095454 A1 | 3/2020 | Woo et al. |
| 2020/0095455 A1 | 3/2020 | Yu et al. |
| 2020/0095456 A1 | 3/2020 | Choi et al. |
| 2020/0099008 A1 | 3/2020 | Woo et al. |

FOREIGN PATENT DOCUMENTS

| | | |
|---|---|---|
| JP | 2006335985 A | 12/2006 |
| JP | 2009007502 A | 1/2009 |
| JP | 2012129010 A | 7/2012 |
| JP | 2014194881 A | 10/2014 |
| JP | 2015502868 A | 1/2015 |
| JP | 2019528355 A | 10/2019 |
| KR | 20150090059 A | 8/2015 |
| KR | 20150135222 A | 12/2015 |
| KR | 20170118809 A | 10/2017 |
| KR | 20180066875 A | 6/2018 |
| KR | 20180066876 A | 6/2018 |
| KR | 20180066877 A | 6/2018 |
| KR | 20180066878 A | 6/2018 |
| KR | 20180066879 A | 6/2018 |
| KR | 20180066880 A | 6/2018 |
| KR | 20180066881 A | 6/2018 |
| WO | 2018106088 A1 | 6/2018 |

* cited by examiner

[Figure 1]
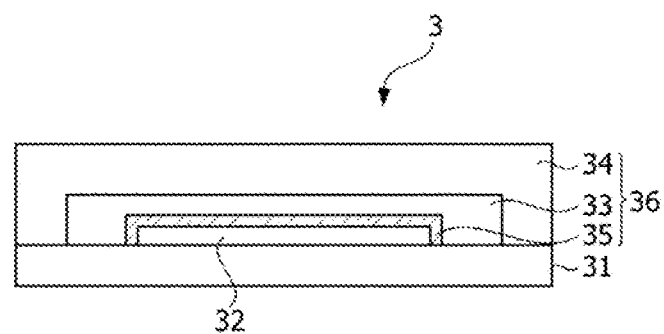
[Figure 2]
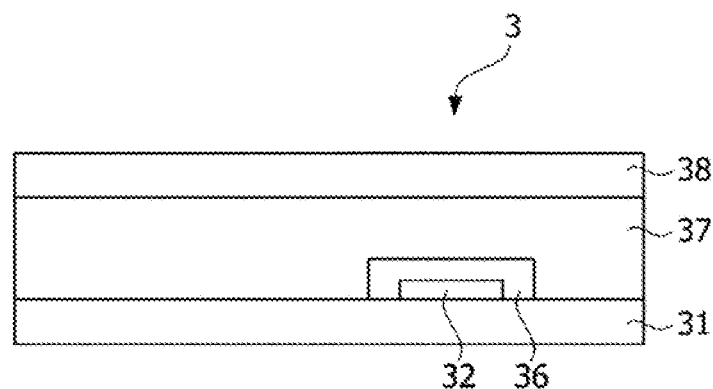

ENCAPSULATING COMPOSITION

CROSS-REFERENCE TO RELATED APPLICATIONS

This application is a national phase entry under 35 U.S.C. § 371 of International Application No. PCT/KR2019/011683 filed Sep. 10, 2019, which claims priority from Korean Patent Application No. 10-2018-0108025 filed Sep. 11, 2018, all of which are incorporated herein by reference.

TECHNICAL FIELD

The present application relates to an encapsulating composition, an organic electronic device comprising the same, and a method for manufacturing the organic electronic device.

BACKGROUND ART

An organic electronic device (OED) means a device comprising a layer of an organic material that generates an alternating current of electric charges using holes and electrons. An example of the OED may include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In the conventional organic electronic device, the organic layer constituting the organic electronic device has been formed to have a thick thickness, in order to prevent the occurrence of interference between circuits of the electronic device. However, when the organic layer is thick, it is difficult to manufacture a thin organic electronic device.

Therefore, there is a need for an encapsulating composition that has excellent spreadability, is applicable to thin organic electronic devices and has excellent hardness of the cured product after curing, while being capable of improving the occurrence of the inter-circuit interference problem of the electronic device.

DISCLOSURE

Technical Problem

It is an object of the present application to provide an encapsulating composition that can effectively block moisture or oxygen introduced into an organic electronic device from the outside, and is applicable to a thin organic electronic device without causing an inter-circuit interference problem.

Technical Solution

Among physical properties mentioned in this specification, when the measured temperature affects the results, the relevant physical properties are physical properties measured at room temperature, unless otherwise specified. The term room temperature is a natural temperature without being heated or cooled, which may be, for example, any temperature in a range of 10° C. to 30° C., or about 23° C. or about 25° C. or so. In addition, unless otherwise specified herein, the unit of temperature is ° C.

Among physical properties mentioned in this specification, when the measured pressure affects the results, the relevant physical properties are physical properties measured at room pressure, unless otherwise specified. The term normal pressure is a natural pressure without being pressurized or depressurized, where usually about 1 atm or so is referred to as the normal pressure.

In one example of the present application, the present application relates to an encapsulating composition. The encapsulating composition may be a sealing material applied to sealing or encapsulating an organic electronic device such as, for example, an OLED. In one example, the encapsulating composition of the present application can be applied to sealing or encapsulating the top side of an organic electronic element. Thus, after the encapsulating composition is applied to the encapsulation, it may be present in an organic layer form sealing the top side of the organic electronic element. In addition, the organic layer may be laminated on the organic electronic element together with a protective film and/or an inorganic layer, which is described below, to form a sealing structure.

In an embodiment of the present application, the present application relates to an encapsulating composition for sealing an organic electronic element applicable to an inkjet printing process, where the composition may be designed to have appropriate physical properties, when it has been discharged onto a substrate by using inkjet printing capable of non-contact type patterning.

In the present application, the term organic electronic device means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

As one example, the encapsulating composition comprises an aliphatic carbobicycle compound having one or more functional groups.

The one or more functional groups are not particularly limited, but may be an epoxy group or a (meth)acryl group. In the present application, the term (meth)acryl group means an acryl group or a methacryl group.

The term bicycle compound means a compound having two bonded ring structures in a structural formula. The bicycle compounds can be divided into spirocyclic compounds in which two rings share one atom, fused bicyclic compounds in which two rings share two adjacent atoms, and bridged bicyclic compounds in which two rings share three or more atoms.

The term carbobicycle compound means a compound in which atoms constituting two bonded rings are all carbon atoms.

The term aliphatic carbobicycle compound means a compound in which all atoms constituting the carbobicycle compound consist of only hydrogen and carbon, wherein the atoms constituting two rings are all carbon atoms.

In the present application, the aliphatic carbobicycle compound may mean a compound composed of only hydrogen atoms and carbon atoms, as a compound having a structure in which two rings share three or more carbon atoms, wherein the atoms constituting two rings are all carbon atoms.

For example, the aliphatic carbobicycle compound may mean a saturated aliphatic carbobicycle having 7 to 18 carbon atoms. In one embodiment, it may be exemplified by bicyclo[2.2.1]heptane, biscyclo[3.1.1]heptane, bicyclo[3.2.1]octane, bicyclo[4.3.2]undecane, biscyclo[3.3.3]undecane, and the like, but is not limited thereto.

As one example, the aliphatic carbobicycle compound may be a saturated aliphatic carbobicycle compound having a structure represented by Formula 1 or Formula 2 below.

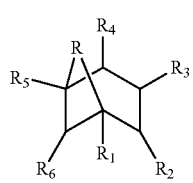

[Formula 1]

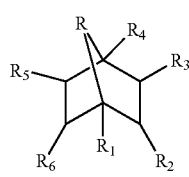

[Formula 2]

In Formulas 1 and 2 above, R represents a $C_{1-6}$ alkylene group unsubstituted or substituted with a $C_{1-4}$ alkyl group, and $R_1$ to $R_6$ each independently represent hydrogen, a $C_{1-4}$ alkyl group, or a (meth)acryl group or form an alicyclic ring or an epoxy group together with an adjacent substituent, where the compounds of Formula 1 and Formula 2 have at least one or more (meth)acryl groups or epoxy groups.

The compounds having the structures represented by Formula 1 and Formula 2 may be exemplified by dicyclopentadiene dioxide, alpha-pinene oxide, beta-pinene oxide, 2,3-epoxynorbornane, isobornyl acrylate, isobornyl methacrylate, tricyclodecane dimethanol diacrylate or tricyclodecane dimethanol dimethacrylate, and the like, but are not limited thereto.

As one example, the aliphatic carbobicycle compound may be included in a range of about 1 part by weight to about 50 parts by weight relative to 100 parts by weight of the encapsulating composition. In another example, the amount may be about 5 parts by weight or more, or about 10 parts by weight or more, and may be about 45 parts by weight or less, or about 40 parts by weight or less.

By controlling the content range of the aliphatic carbobicycle compound, an organic layer having a low dielectric constant can be provided. Therefore, because the low dielectric constant can be realized, the inter-circuit interference problem does not occur, even if a thin dielectric layer is applied to the organic electronic device, so that an organic electronic device capable of thinning can be provided.

As one example, the encapsulating composition may comprise one or more selected from the group consisting of an epoxy compound having a cyclic structure in the molecular structure, a linear or branched aliphatic epoxy compound and a compound having an oxetane group. In one embodiment, the encapsulating composition may comprise all of an epoxy compound having a cyclic structure in the molecular structure, a linear or branched aliphatic epoxy compound and a compound having an oxetane group.

The epoxy compound having a cyclic structure in the molecular structure is not particularly limited, but for example, the ring constituent atoms in the molecular structure may be in a range of 3 to 10, 4 to 8 or 5 to 7 and the number of cyclic structures in the compound may be 1 or more, or 2 or more, may be or 10 or less.

In one embodiment, the epoxy compound having a cyclic structure in the molecular structure may be exemplified by 3,4-epoxycyclohexylmethyl-3',4'-epoxycyclohexane carboxylate and its derivatives, vinylcyclohexene dioxide and its derivatives, 1,4-cyclohexanedimethanol bis(3,4-epoxycyclohexanecarboxylate) and its derivatives, 1,2-epoxy-4-vinylcyclohexane and its derivatives or 1,1'-bi-7-oxabicyclo[4.1.0]heptane and its derivatives, but is not limited thereto.

The epoxy compound having a cyclic structure in the molecular structure may be included in a range of 5 parts by weight to 150 parts by weight relative to 100 parts by weight of the aliphatic carbobicycle compound. In another example, the amount may be about 10 parts by weight or more, 15 parts by weight or more, or about 20 parts by weight or more, and may be about 140 parts by weight or less, 130 parts by weight or less, 120 parts by weight or less, or about 110 parts by weight or less.

The linear or branched aliphatic epoxy compound may include, for example, 1,4-butanediol diglycidyl ether, ethyleneglycol diglycidyl ether, 1,6-hexanediol diglycidyl ether, propyleneglycol diglycidyl ether, diethyleneglycol diglycidyl ether, butyl glycidyl ether, 2-ethylhexyl glycidyl ether or neopentylglycol diglycidyl ether, and the like, but is not limited thereto.

The linear or branched aliphatic epoxy compound may be included in a range of 20 parts by weight to 300 parts by weight relative to 100 parts by weight of the aliphatic carbobicycle compound. As another example, the amount may be about 30 parts by weight or more, 35 parts by weight or more, 40 parts by weight or more, or about 45 parts by weight or more, and may be about 280 parts by weight or less, 260 parts by weight or less, 240 parts by weight or less, or about 220 parts by weight or less.

By controlling the content range of the epoxy compound having a cyclic structure in the molecular structure and the linear or branched aliphatic epoxy compound, the present application makes it possible for the encapsulating composition to prevent element damage in sealing the top side of an organic electronic element and to have appropriate physical properties capable of inkjet printing, for the cured product after curing to have excellent hardness and also to realize excellent moisture barrier properties together.

The compound having an oxetane group may be exemplified by, for example, bis[1-ethyl(3-oxetyl)]methyl ether, 3-ethyl-3-(cyclohexyl)methyl oxetane, oxetane silicate, 3-ethyl-3-hydroxymethyl-oxetane, 1,4-bis[{(3-ethyloxetan-1-yl)methoxy}methyl]benzene, 3-ethyl-3-[(2-ethylhexyloxy)methyl]oxetane, 3-ethyl-3-hydroxymethyl-oxetane, 4,4'-bis[(3-ethyl-3-oxetanyl)methoxymethyl]bisphenyl, bis[(3-ethyl-3-oxetanyl)methyl] terephthalate or (3-ethyl-3-oxetanyl)methoxymethyl methacrylate, and the like, but is not limited thereto.

The compound having an oxetane group may be included in a range of 40 parts by weight to 800 parts by weight relative to 100 parts by weight of the aliphatic carbobicycle compound. In another example, the amount may be about 50 parts by weight or more, or about 60 parts by weight or more, and may be about 750 parts by weight or less, 700 parts by weight or less, or about 650 parts by weight or less.

By controlling the content range of the compound having an oxetane group, the present application can form an organic layer on an organic electronic element by an inkjet printing method and provide an organic layer that the applied encapsulating composition has excellent spreadability in a short time and the cured product after curing has excellent hardness.

As one example, the encapsulating composition of the present application may further comprise a photoinitiator. The photoinitiator may be a free radical photoinitiator or an ionic photoinitiator. In addition, the photoinitiator may be a compound absorbing a wavelength in a range of 200 nm to 400 nm. The present application can implement excellent curing properties in the specific composition of the present application by using the photoinitiator.

The free radical photoinitiator may be appropriately selected in consideration of the curing rate and the physical properties of the organic layer, and the like, and for example, a benzoin-based, hydroxyketone-based, aminoketone-based or phosphine oxide-based photoinitiator may be used. In one embodiment, benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropane-1one, 1-hydroxycyclohexyl phenylketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl] propanone] or 2,4,6-trimethylbenzoyl-diphenylphosphine oxide may be used, without being limited thereto.

The ionic photoinitiator may be, for example, a cationic photopolymerization initiator. As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. Diaryliodonium salt, triarylsulfonium salt or aryldiazonium salt and the like can be exemplified as the initiator of the onium salt series. Iron arene or the like can be exemplified as the initiator of the organometallic salt series. o-nitrobenzyl triaryl silyl ether, triaryl silyl peroxide or an acyl silane and the like can be exemplified as the initiator of the organosilane series. α-sulfonyloxy ketone or α-hydroxymethylbenzoin sulfonate and the like can be exemplified as the initiator of the latent sulfonic acid series.

The photoinitiator may be included in the encapsulating composition in a range of about 5 parts by weight to about 80 parts by weight relative to 100 parts by weight of the aliphatic carbobicycle compound. As another example, the amount may be about 8 parts by weight or more, 10 parts by weight or more, or about 12 parts by weight or more, and may be about 75 parts by weight or less, 70 parts by weight or less, or about 65 parts by weight or less.

By adjusting the photoinitiator content range, because of the properties of the encapsulating composition of the present application directly applied to an organic electronic element, the present application may minimize physical and chemical damage to the element.

The encapsulating composition of the present application may further comprise a surfactant. In one example, the surfactant may comprise a polar functional group, and the polar functional group may be present at the compound structural end of the surfactant. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the aliphatic carbobicycle compound, the epoxy compound and the compound having an oxetane group as described above to provide excellent coating properties on the organic electronic element. On the other hand, in the case of a surfactant containing a polar reactive group, it may have high affinity with the other components of the encapsulating composition as described above, thereby realizing an excellent effect in terms of adhesion. In an embodiment of the present application, a hydrophilic fluorine-based surfactant or non-silicone-based surfactant may be used to improve coating properties by an inkjet printing method on a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F-554, F-560, F-561, F-562, F-563, F-565, F-568, F-570 or F-571 from DIC (DaiNippon Ink Chemicals), or Surflon S-111, S-112, S-113, S-121, S-131, S-132, S-141 or S-145 from Asahi Glass Co., Fluorad FC-93, FC-95, FC-98, FC-129, FC-135, FC-170C, FC-430 or FC-4430 from Sumitomo 3M Ltd., or Zonyl FS-300, FSN, FSN-100 or FSO from DuPont; and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ or BYK-DYNWET 800 from BYK, and the like.

The surfactant may be included in an amount of about 0.1 parts by weight to about 10 parts by weight, about 0.2 parts by weight to about 10 parts by weight, about 0.4 parts by weight to about 10 parts by weight, about 0.5 parts by weight to about 8 parts by weight or about 1 part by weight to about 4 parts by weight, relative to 100 parts by weight of the aliphatic carbobicycle compound. Within the content range, the present application makes it possible that the encapsulating composition is applied to an inkjet printing method to form an organic layer of a thin film.

As one example, the encapsulating composition may further comprise a photosensitizer in order to complement the curing property at a long wavelength activation energy beam of about 300 nm or more. The photosensitizer may be a compound that absorbs a wavelength in a range of about 200 nm to about 400 nm, about 250 nm to about 400 nm, about 300 nm to about 400 nm or about 350 nm to about 395 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4- methoxybenzophenone or 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one or propanone; a fluorene-based compound such as 9-fluorenone, 2-chloro-9-fluorenone or 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) or diisopropylthioxanthone; a xanthone-based compound such as xanthone or 2-methylxanthone; an anthraquinone-based compound such as anthraquinone, 2-methylanthraquinone, 2-ethylanthraquinone, t-butylanthraquinone or 2,6-dichloro-9,10-anthraquinone; an acridine-based compound such as 9-phenylacridine, 1,7-bis(9-acridinyl)heptane, 1,5-bis(9-acridinylpentane) or 1,3-bis(9-acridinyl)propane; a dicarbonyl compound such as benzyl, 1,7,7-trimethyl-bicyclo[2,2,1]heptane-2,3-dione or 9,10-phenanthrenequinone; a phosphine oxide-based compound such as 2,4,6-trimethylbenzoyldiphenylphosphine oxide or bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate or 2-n-butoxyethyl-4-(dimethylamino) benzoate; an amine-based synergist such as 2,5-bis(4-diethylaminobenzal)cyclopentanone, 2,6-bis(4-diethylaminobenzal)cyclohexanone or 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino) coumarin, 3-benzoyl-7-(diethylamino)coumarin, 3-benzoyl-7-methoxy-coumarin or 10,10-carbonylbis[1,1,7,7-tetramethyl-2,3,6,7-tetrahydro-1H,5H,11H—Cl]-[6,7,8-ij]-quinolizin-11-one; a chalcone compound such as 4-diethylaminochalcone or 4-azidobenzalacetophenone; 2-benzoylmethylene; and 3-methyl-b-naphthothiazoline.

The photosensitizer may be included in a range of 10 parts by weight to 40 parts by weight, 12 parts by weight to 38 parts by weight or 14 parts by weight to 36 parts by weight relative to 100 parts by weight of the photoinitiator. By adjusting the content of the photosensitizer, the present application can prevent the photosensitizer from being dissolved in the coating of the inkjet printing method to lower adhesive force, while implementing a curing sensitivity synergistic action at a desired wavelength.

The encapsulating composition of the present application may further comprise a coupling agent. The present application can improve adhesiveness of a cured product of the encapsulating composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include an epoxy-based silane coupling agent such as 3-glycidyloxypropyltrimethoxysilane, 3-glycidyloxypropyltriethoxysilane, 3-glycidyloxypropyl (dimethoxy)methylsilane or 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane or 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane or N-(2-aminoethyl)-3-aminopropyldimethoxymethylsilane; a ureido-based silane coupling agent such as 3-ureidopropyltriethoxysilane; a vinyl-based silane coupling agent such as vinyltrimethoxysilane, vinyltriethoxysilane or vinylmethyldiethoxysilane; a styryl-based silane coupling agent such as p-styryltrimethoxysilane; an acrylate-based silane coupling agent such as 3-acryloxypropyltrimethoxysilane or 3-methacryloxypropyltrimethoxysilane; an isocyanate-based silane coupling agent such as 3-isocyanatopropyltrimethoxysilane; or a sulfide-based silane coupling agent such as bis(triethoxysilylpropyl)disulfide or bis(triethoxysilylpropyl)tetrasulfide; and the like, but is not limited thereto.

In the present application, the coupling agent may be included in an amount of 0.1 parts by weight to 20 parts by weight or 0.5 parts by weight to 15 parts by weight relative to 100 parts by weight of the aliphatic carbobicycle compound. Within the above range, the present application can realize an effect of improving the adhesiveness by the addition of the coupling agent.

In one example, the encapsulating composition may further comprise an inorganic filler, if necessary. The specific type of the usable filler in the present application is not particularly limited, and for example, one or a mixture of two or more of clay, talc, alumina, calcium carbonate, silica, and the like may be used.

The encapsulating composition of the present application may comprise 0 parts by weight to 50 parts by weight, 1 part by weight to 40 parts by weight, 1 part by weight to 20 parts by weight, or 1 to 10 parts by weight of inorganic filler, relative to 100 parts by weight of the aliphatic carbocycle compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the encapsulating composition according to the present application may comprise various additives in the range without affecting the above-described effects of invention. For example, the encapsulating composition may comprise a defoamer, a tackifier, an ultraviolet stabilizer or an antioxidant and the like in an appropriate range of content depending on the desired physical properties.

As one example, the cured product of the encapsulating composition of the present application may have pencil hardness of 2H or more.

The pencil hardness may be measured using a cured product formed by purging the encapsulating composition with nitrogen gas for 30 minutes and then UV-curing the encapsulating composition at a light quantity of about 1,000 mJ/cm$^2$.

The method of measuring the pencil hardness can be performed using a pencil hardness tester. Specifically, it can be measured by moving the pencil to a length of 15 mm at a speed of 273 mm/min and a pencil angle of 45 degrees with a load of 500 gf on the cured product of the encapsulating composition to be measured.

When the cured product of the encapsulating composition has pencil hardness of 2H or more, it may have excellent durability and scratch resistance.

As one example, the encapsulating composition of the present application may be in a liquid phase at room temperature, for example, 25° C. In one embodiment, the encapsulating composition may be in a solventless form liquid phase. The encapsulating composition may be applied to sealing an organic electronic element, and specifically, may be applied to sealing the top side of the organic electronic element. The encapsulating composition of the present application may have a specific composition and physical properties to be capable of inkjet printing.

As one example, the encapsulating composition of the present application may be an ink composition. In one embodiment, the encapsulating composition may be an ink composition in a solventless form capable of an inkjet printing process. The encapsulating composition of the present application may have a specific composition and physical properties so that inkjet printing can be performed.

As one example, the encapsulating composition of the present application may have a viscosity of 50 cP or less as measured at room temperature. Specifically, the viscosity measured by Brookfield's DV-3 at about 25° C. with a torque of about 90% and a shear rate in a range of about 5 rpm to about 20 rpm may be about 50 cP or less. In another example, the viscosity of the encapsulating composition may be in the range of about 1 cP to about 46 cP, or about 5 cP to about 44 cP.

By controlling the viscosity of the composition within the above range, the present application can realize physical properties that inkjet printing can be performed and increase coating properties, at the time of being applied to an organic electronic element, to provide a sealing material of a thin film.

As one example, the encapsulating composition may form an organic layer by inducing crosslinking by light irradiation. The light irradiation may comprise irradiation of light having a wavelength range of about 250 nm to about 450 nm or about 300 nm to about 450 nm at a light quantity of 300 mJ/cm$^2$ to 6,000 mJ/cm$^2$ or a light quantity of 500 mJ/cm$^2$ to 4,000 mJ/cm$^2$.

As one example, the encapsulating composition of the present application may have a surface energy of the organic layer after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

The present application also relates to an organic electronic device. As shown in FIG. 1, an exemplary organic electronic device (3) may comprise a substrate (31); an organic electronic element (32) formed on the substrate (31); and an organic layer (33) sealing the top side of the organic electronic element (32) and formed by the above-described encapsulating composition.

In an embodiment of the present application, the organic electronic element (32) may comprise a first electrode layer, an organic material layer formed on the first electrode layer and containing at least a light emitting layer, and a second electrode layer formed on the organic material layer. The first electrode layer may be a transparent electrode layer or a reflective electrode layer, and the second electrode layer may also be a transparent electrode layer or a reflective electrode layer. More specifically, the organic electronic element (32) may comprise a reflective electrode layer formed on a substrate, an organic material layer formed on the reflective electrode layer and containing at least a light emitting layer, and a transparent electrode layer formed on the organic material layer.

In the present application, the organic electronic element (32) may be an organic light emitting diode.

In one example, the organic electronic device according to the present application may be a top emission type, but is not limited thereto, and may be applied to a bottom emission type.

The organic electronic device (3) may further comprise a protective film (35) for protecting the electrodes and the light emitting layer of the element (32). The protective film (35) may be an inorganic protective film. The protective film may be a protective layer by chemical vapor deposition (CVD), where the material may be the same as or different from an inorganic layer to be described below and a known inorganic material may be used. For example, as the protective film (35), silicon nitride (SiNx) may be used. In one example, silicon nitride (SiNx) used as the protective film can be deposited to a thickness of about 0.01 μm to about 50 μm.

As an example, the organic electronic device (3) may further comprise an inorganic layer (34) formed on the organic layer (33). The material of the inorganic layer (34) is not limited, which may be the same as or different from the above-described protective film (35). In addition, the inorganic layer (34) may be formed in the same method as the protective film (35). In one example, the inorganic layer (34) may be one or more metal oxides or nitrides selected from the group consisting of Al, Zr, Ti, Hf, Ta, In, Sn, Zn and Si. The inorganic layer may have a thickness of about 0.01 μm to about 50 μm, about 0.1 μm to about 20 μm, or about 1 μm to about 10 μm. In one example, the inorganic layer (34) of the present application may be an inorganic material without any dopant, or may be an inorganic material containing a dopant. The dopant which may be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto.

The organic layer has a dielectric constant of 3.5 or less. In another example, the dielectric constant may be about 3.4 or less, about 3.3 or less, or about 3.2 or less, and may be about 2 or more, about 2.1 or more, about 2.2 or more, about 2.3 or more, about 2.4 or more, or about 2.5 or more. The dielectric constant of the organic layer can be measured using an impedance/gain-phase analyzer (HP 4194A) as one example. In one embodiment, after an organic layer having a thickness of about 20 μm or so is formed by depositing aluminum to about 50 nm or so on glass, coating the encapsulating composition thereon by the inkjet printing method and UV-curing it with a light quantity of about 4,000 mJ/cm$^2$, the dielectric constant of the organic layer may be measured using a specimen in which aluminum is deposited to about 50 nm or so on the organic layer. When the dielectric constant of the organic layer corresponds to the low dielectric constant of the above range, the inter-circuit interference problem does not occur, even if a thin dielectric layer is applied to the organic electronic device, whereby an organic electronic device capable of thinning can be provided.

The organic layer may have a thickness of 20 μm or less. In another example, it may be in a range of about 2 μm to about 20 μm, about 2.5 μm to about 15 μm, or about 2.8 μm to about 9 μm. The present application can provide a thin organic electronic device by providing a thin organic layer.

The organic electronic device (3) of the present application may comprise a sealing structure (36) containing the organic layer (33) and the inorganic layer (34), as described above, where the sealing structure (36) may comprise at least one or more organic layers (33) and at least one or more inorganic layers (34), and the organic layer (33) and the inorganic layer (34) may be repeatedly laminated. For example, the organic electronic device may have a structure of substrate/organic electronic element/protective film/(organic layer/inorganic layer)n, where n may be a number in a range of 1 to 100. FIG. 1 is a cross-sectional view exemplarily showing a case where n is 1.

As one example, the organic electronic device (3) of the present application may further comprise a cover substrate present on the organic layer (33). The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Also, as shown in FIG. 2, the organic electronic device (3) may further comprise a sealing film (37) existing between the cover substrate (38) and the substrate (31) on which the organic electronic element (32) is formed. The sealing film (37) may be applied as a use for attaching the substrate (31) on which the organic electronic element (32) is formed and the cover substrate (38), which may be, for example, a pressure-sensitive adhesive film or an adhesive film, but is not limited thereto. The sealing film (37) may seal the top side of the sealing structure (36) of the above-described organic layer and inorganic layer, laminated on the organic electronic element (32).

The present application also relates to a method for manufacturing an organic electronic device.

In one example, the manufacturing method may comprise a step of forming an organic layer (33) on a substrate (31) in which an organic electronic element (32) is formed on its upper part, so that the above-described encapsulating composition seals the top side of the organic electronic element (32).

Here, it may be produced by forming a reflective electrode or a transparent electrode on a substrate (31) such as glass or a polymer film, as the substrate (31) of the organic electronic element (32), by a method such as vacuum deposition or sputtering, and forming an organic material layer on the reflective electrode. The organic material layer may comprise a hole injecting layer, a hole transporting layer, a light emitting layer, an electron injecting layer, and/or an electron transporting layer. Subsequently, a second electrode is further formed on the organic material layer. The second electrode may be a transparent electrode or a reflective electrode.

The manufacturing method of the present application may further comprise a step of forming a protective film (35) on the first electrode, the organic material layer and the second electrode, formed on the substrate (31). Then, the above-described organic layer (33) is applied to cover the top side of the organic electronic element (32) on the substrate (31). Here, the step of forming the organic layer (33) is not particularly limited and the above-described encapsulating composition may be applied to the top side of the substrate (31) using a process such as inkjet printing, gravure coating, spin coating, screen printing or reverse offset coating.

The manufacturing method may further comprise a step of irradiating the organic layer with light. In the present invention, a curing process may also be performed on an organic layer sealing an organic electronic device, and such a curing process may be performed, for example, in a heating chamber or a UV chamber, and preferably, may be performed in a UV chamber. In one example, the organic layer may be formed by applying the above-described encapsulating composition by an inkjet printing method and inducing cross-linking of the applied encapsulating composition by light irradiation, where it may be irradiated with light in the wavelength range of 250 nm to 450 nm and the light quantity range of 300 mJ/cm$^2$ to 6,000 mJ/cm$^2$ to form the organic layer.

In addition, the manufacturing method of the present application may further comprise a step of forming an inorganic layer (34) on the organic layer (33). As the step of forming an inorganic layer (34), a known method in the art may be used, which may be the same as or different from the above-described method of forming a protective film ((35) in FIG. 1).

Advantageous Effects

The present application can provide an encapsulating composition which can effectively block moisture or oxygen introduced into an organic electronic device from the outside, and has excellent spreadability, is applicable to thin organic electronic devices and has excellent hardness of the cured product after curing, without causing an inter-circuit interference problem.

BRIEF DESCRIPTION OF DRAWINGS

FIGS. 1 and 2 are cross-sectional diagrams illustrating an organic electronic device according to one example of the present invention.

MODE FOR INVENTION

Hereinafter, the present application will be described in detail by way of examples, but the scope of the present application is not limited by the following examples.

Dielectric Constant Evaluation of Organic Layer

After an organic layer having a thickness of about 20 μm or so was formed by depositing aluminum to about 50 nm or so on glass, coating each of the encapsulating compositions prepared in the following examples and comparative examples thereon by the inkjet printing method and UV-curing it with a light quantity of about 4,000 mJ/cm$^2$, aluminum was deposited to about 50 nm or so on the organic layer to produce a specimen. The dielectric constant of the produced specimen was measured using an impedance/gain-phase analyzer (HP 4194A).

Viscosity of Encapsulating Composition

A viscosity was measured using each of the encapsulating compositions prepared through Examples and Comparative Example. Specifically, it was measured by Brookfield's DV-3 at about 25° C. with a torque of about 90% and a shear rate in a range of about 5 rpm to about 20 rpm.

Pencil Hardness

Pencil hardness was measured using a cured product formed by purging each of the encapsulating compositions prepared through Examples and Comparative Example with nitrogen gas for 30 minutes and then UV-curing the encapsulating composition at a light quantity of about 1,000 mJ/cm$^2$.

The measurement of the pencil hardness was made using a pencil hardness tester. Specifically, it was measured by moving the pencil to a length of 15 mm at a speed of 273 mm/min and a pencil angle of 45 degrees with a load of 500 gf on the cured product.

Example 1

An aliphatic carbobicycle compound (dicyclopentadiene dioxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 10:10:20:54:6 (TTA27: Celloxide 2021P: DE203: OXT-221: CPI-310B) at room temperature.

In the mixing vessel, a uniform encapsulating composition was prepared using a planetary mixer (Kurabo, KK-250s).

Example 2

An encapsulating composition was prepared in the same method as in Example 1, except that an aliphatic carbobicycle compound (dicyclopentadiene dioxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 20:10:20:44:6 (TTA27: Celloxide 2021P: DE203: OXT-221: CPI-310B) at room temperature.

Example 3

An encapsulating composition was prepared in the same method as in Example 1, except that an aliphatic carbobicycle compound (dicyclopentadiene dioxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 30:10:20:34:6 (TTA27: Celloxide 2021P: DE203: OXT-221: CPI-310B) at room temperature.

Example 4

An encapsulating composition was prepared in the same method as in Example 1, except that an aliphatic carbobicycle compound (dicyclopentadiene dioxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 40:10:20:24:6 (TTA27: Celloxide 2021P: DE203: OXT-221: CPI-310B) at room temperature.

Example 5

An encapsulating composition was prepared in the same method as in Example 1, except that an aliphatic carbobicycle compound (α-pinene oxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 10:10:20:54:6 (α-pinene oxide: Celloxide 2021P: DE203: OXT-221: CPI-310B) at room temperature.

Example 6

An encapsulating composition was prepared in the same method as in Example 1, except that an aliphatic carbobicycle compound (α-pinene oxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 20:10:20:44:6 (α-pinene oxide: Celloxide 2021P: DE203: OXT-221: CPI-310B) at room temperature.

Example 7

An encapsulating composition was prepared in the same method as in Example 1, except that an aliphatic carbobicycle compound (α-pinene oxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 30:10:20:34:6 (α-pinene oxide: Celloxide 2021P: DE203: OXT-221: CPI-310B) at room temperature.

Example 8

An encapsulating composition was prepared in the same method as in Example 1, except that an aliphatic carbobicycle compound (α-pinene oxide), an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 40:10:20:24:6 (α-pinene oxide: Celloxide 2021P: DE203: OXT-221: CPI-310B) at room temperature.

Comparative Example

An encapsulating composition was prepared in the same method as in Example 1, except that an epoxy compound having cyclic structure in the molecular structure (Celloxide 2021P from Daicel), a linear or branched aliphatic epoxy compound (HAJIN CHEM TECH, DE203), an oxetane group-containing compound (OXT-221 from TOAGOSEI) and a photoinitiator (CPI-310B from San-Apro) were each introduced into a mixing vessel at a weight ratio of 20:20:54:6 (Celloxide 2021P: DE203: OXT-221: CPI-310B) at room temperature.

Table 1 below is results of evaluating dielectric constants of dielectric layers which are cured products of the encapsulating compositions of Examples and Comparative Example.

TABLE 1

| Classification | Example | | | | | | | | Comparative Example |
|---|---|---|---|---|---|---|---|---|---|
| | 1 | 2 | 3 | 4 | 5 | 6 | 7 | 8 | |
| Dielectric constant | 2.92 | 2.82 | 2.80 | 2.95 | 3.10 | 3.00 | 2.82 | 3.02 | 3.52 |
| Viscosity (cP) | 12.5 | 20.1 | 24.8 | 29.5 | 6.2 | 7.5 | 10.36 | 11.9 | 19.8 |
| Pencil hardness | 3H | 4H | 5H | 5H | 3H | 4H | 5H | 5H | H |

Through Table 1 above, in the case of Examples 1 to 8 including the aliphatic carbobicycle compound in an amount of 10 parts by weight, 20 parts by weight, 30 parts by weight or 40 parts by weight relative to 100 parts by weight of the encapsulating composition, the dielectric constants of the organic layers as the cured products were measured to be 3.5 or less, so that the occurrence of the inter-circuit interference problem could be improved; all the viscosities were also measured to be 30 cP or less, thereby indicating that the spreadability was excellent; and the cured products were found to have excellent scratch resistance with the pencil hardness of 2H or more.

In comparison with these, in the case of Comparative Example including no aliphatic carbobicycle compound in the encapsulating composition, the viscosity was excellent, but the pencil hardness was low as H, while the dielectric constant was high at 3.52 or so.

The invention claimed is:

1. An encapsulating composition comprising an aliphatic carbobicycle compound having one or more functional groups; an epoxy compound having a cyclic structure in the molecular structure; a linear or branched aliphatic epoxy compound; and a compound having an oxetane group,
    wherein the aliphatic carbobicycle compound is included in a range of 1 part by weight to 50 parts by weight relative to 100 parts by weight of the encapsulating composition,
    the epoxy compound having a cyclic structure in the molecular structure is included in a range of 5 parts by weight to 150 parts by weight relative to 100 parts by weight of the aliphatic carbobicycle compound,
    the linear or branched aliphatic epoxy compound is included in a range of 20 parts by weight to 300 parts by weight relative to 100 parts by weight of the aliphatic carbobicycle compound, and
    the compound having an oxetane group is included in a range of 40 parts by weight to 800 parts by weight relative to 100 parts by weight of the aliphatic carbobicycle compound, and
    wherein the encapsulating composition has a viscosity of 50 cP or less as measured at room temperature.

2. The encapsulating composition according to claim 1, wherein an organic layer formed by curing the encapsulating composition has a dielectric constant in a range of 2.0 to 3.5.

3. The encapsulating composition according to claim 1 further comprising a photoinitiator.

4. The encapsulating composition according to claim 3, wherein the photoinitiator is included in a range of 5 parts by weight to 80 parts by weight relative to 100 parts by weight of the aliphatic carbobicycle compound.

5. The encapsulating composition according to claim 1, wherein the encapsulating composition is photo-cured at a light quantity of 300 mJ/cm$^2$ to 6,000 mJ/cm$^2$.

6. The encapsulating composition according to claim 1, wherein a cured product of the encapsulating composition has pencil hardness of 2H or more.

7. The encapsulating composition according to claim 1, wherein the encapsulating composition is an ink composition in a solventless form.

8. The encapsulating composition according to claim 1, wherein the aliphatic carbobicycle compound has one or more functional groups selected from an epoxy group or a (meth)acryl group.

9. The encapsulating composition according to claim 1, wherein the aliphatic carbobicycle compound is bicyclo [2.2.1]heptane, biscyclo[3.1.1]heptane, bicyclo[3.2.1]octane, bicyclo[4.3.2]undecane, or biscyclo[3.3.3]undecane.

10. The encapsulating composition according to claim 1, wherein the aliphatic carbobicycle compound is represented by Formula 1 or Formula 2 below:

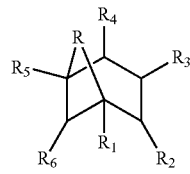

[Formula 1]

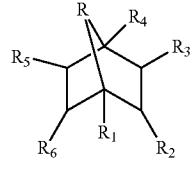

[Formula 2]

in Formulas 1 and 2 above,
    R represents a $C_{1-6}$ alkylene group unsubstituted or substituted with a $C_{1-4}$ alkyl group, and
    $R_1$ to $R_6$ each independently represent hydrogen, a $C_{1-4}$ alkyl group, or a (meth)acryl group, or together with an adjacent substituent form an alicyclic ring or an epoxy group,
    where Formulas 1 and 2 comprise at least one (meth)acryl group or epoxy group.

11. The encapsulating composition according to claim 1, wherein the epoxy compound having a cyclic structure in the molecular structure is 3,4-epoxycyclohexylmethyl-3',4'-epoxycyclohexane carboxylate, vinylcyclohexene dioxide, 1,4-cyclohexanedimethanol bis(3,4-epoxycyclohexanecarboxylate), 1,2-epoxy-4-vinylcyclohexane, 1,1'-bi-7-oxabicyclo[4.1.0]heptane, or derivatives thereof.

12. The encapsulating composition according to claim 1, wherein the linear or branched aliphatic epoxy compound is 1,4-butanediol diglycidyl ether, ethyleneglycol diglycidyl ether, 1,6-hexanediol diglycidyl ether, propyleneglycol diglycidyl ether, diethyleneglycol diglycidyl ether, butyl glycidyl ether, 2-ethylhexyl glycidyl ether or neopentylglycol diglycidyl ether.

13. The encapsulating composition according to claim 1, wherein the compound having an oxetane group is bis[1- ethyl(3-oxetyl)]methyl ether, 3-ethyl-3-(cyclohexyl)methyl oxetane, oxetane silicate, 3-ethyl-3-hydroxymethyl-oxetane, 1,4-bis[{(3-ethyloxetan-1-yl)methoxy}methyl]benzene, 3-ethyl-3-[(2-ethylhexyloxy)methyl]oxetane, 3-ethyl-3-hydroxymethyl-oxetane, 4,4'-bis[(3-ethyl-3-oxetanyl) methoxymethyl]bisphenyl, bis[(3-ethyl-3-oxetanyl)methyl] terephthalate or (3-ethyl-3-oxetanyl)methoxymethyl methacrylate.

\* \* \* \* \*